(12) United States Patent
Zhang

(10) Patent No.: US 9,123,393 B2
(45) Date of Patent: Sep. 1, 2015

(54) DISCRETE THREE-DIMENSIONAL VERTICAL MEMORY

(71) Applicant: HangZhou HaiCun information Technology Co. Ltd., ChengDu (CN)

(72) Inventor: Guobiao Zhang, Corvallis, OR (US)

(73) Assignees: HangZhou KiCun nformation Technology Co. Ltd., HangZhejiang (CN); Guobiao Zhang, Corvallis, OR (US)

(*) Notice: Subject to any disclaimer, the term of this patent is extended or adjusted under 35 U.S.C. 154(b) by 0 days.

(21) Appl. No.: 14/636,359

(22) Filed: Mar. 3, 2015

(65) Prior Publication Data
US 2015/0179230 A1 Jun. 25, 2015

Related U.S. Application Data

(63) Continuation-in-part of application No. 14/047,011, filed on Oct. 6, 2013, now abandoned, which is a continuation-in-part of application No. 13/787,787, filed on Mar. 6, 2013, now Pat. No. 8,890,300, which is a continuation-in-part of application No. 13/591,257, filed on Aug. 22, 2012, now Pat. No. 8,921,991.

(60) Provisional application No. 61/529,929, filed on Sep. 1, 2011.

(51) Int. Cl.
G11C 5/02 (2006.01)
G11C 7/00 (2006.01)

(52) U.S. Cl.
CPC ... *G11C 5/02* (2013.01); *G11C 7/00* (2013.01)

(58) Field of Classification Search
CPC .......... H01L 2924/00014; H01L 2224/48091; H01L 2225/06562; G11C 5/02
USPC ......... 438/238, 241, 257, 258, 262, 264, 266; 257/296, 303, 311, 314, 315, 686
See application file for complete search history.

(56) References Cited

U.S. PATENT DOCUMENTS

| | | |
|---|---|---|
| 4,404,655 A | 9/1983 | Naiff |
| 4,424,579 A | 1/1984 | Roesner |
| 4,598,386 A | 7/1986 | Roesner et al. |
| 4,603,341 A | 7/1986 | Bertin et al. |
| 4,646,266 A | 2/1987 | Ovshinsky et al. |
| 4,796,074 A | 1/1989 | Roesner |
| 4,939,568 A | 7/1990 | Kato et al. |
| 5,257,224 A | 10/1993 | Nojiri et al. |
| 5,272,370 A | 12/1993 | French |
| 5,375,085 A | 12/1994 | Gnade et al. |
| 5,455,435 A | 10/1995 | Fu et al. |
| 5,468,983 A | 11/1995 | Hirase et al. |
| 5,721,169 A | 2/1998 | Lee |
| 5,751,012 A | 5/1998 | Wolstenholme et al. |

(Continued)

*Primary Examiner* — Kyoung Lee
*Assistant Examiner* — Ratisha Mehta

(57) ABSTRACT

The present invention discloses a discrete three-dimensional vertical memory (3D-$M_V$). It comprises at least a 3D-array die and at least a voltage-generator die. The 3D-array die comprises a plurality of vertical memory strings. At least a voltage-generator component for the 3D-array die is located on the voltage-generator die instead of the 3D-array die. The 3D-array die and the voltage-generator die have substantially different back-end-of-line (BEOL) structures.

20 Claims, 8 Drawing Sheets

(56) References Cited

U.S. PATENT DOCUMENTS

| | | |
|---|---|---|
| 5,825,686 A | 10/1998 | Schmitt-Landsiedel et al. |
| 5,835,396 A | 11/1998 | Zhang |
| 5,838,530 A | 11/1998 | Zhang |
| 5,841,150 A | 11/1998 | Gonzalez et al. |
| 5,843,824 A | 12/1998 | Chou et al. |
| 5,847,442 A | 12/1998 | Mills, Jr. et al. |
| 5,854,111 A | 12/1998 | Wen |
| 5,904,526 A | 5/1999 | Wen et al. |
| 5,907,778 A | 5/1999 | Chou et al. |
| 5,943,255 A | 8/1999 | Kutter et al. |
| 6,015,738 A | 1/2000 | Levy et al. |
| 6,021,079 A | 2/2000 | Worley |
| 6,034,882 A | 3/2000 | Johnson et al. |
| 6,049,481 A | 4/2000 | Yamasaki |
| 6,055,180 A | 4/2000 | Gudesen et al. |
| 6,185,122 B1 | 2/2001 | Johnson et al. |
| 6,221,723 B1 | 4/2001 | Kunitou |
| 6,236,587 B1 | 5/2001 | Gudesen et al. |
| 6,380,597 B1 | 4/2002 | Gudesen et al. |
| 6,624,485 B2 | 9/2003 | Johnson |
| 6,717,222 B2 | 4/2004 | Zhang |
| 6,903,427 B2 | 6/2005 | Zhang |
| 7,386,652 B2 | 6/2008 | Zhang |
| 7,423,304 B2 | 9/2008 | Cleeves et al. |
| 7,449,376 B2 | 11/2008 | Isobe et al. |
| 7,728,391 B2 | 6/2010 | Zhang |
| 8,325,527 B2 | 12/2012 | Jin et al. |
| 8,345,479 B2 | 1/2013 | Maejima |
| 8,519,472 B2 | 8/2013 | Jeong et al. |
| 8,638,611 B2 | 1/2014 | Sim et al. |
| 2007/0252153 A1 | 11/2007 | Koyama |
| 2008/0130342 A1* | 6/2008 | Zhang ............... 365/51 |
| 2008/0159722 A1* | 7/2008 | Zhang ............... 386/124 |
| 2009/0073795 A1* | 3/2009 | Pyeon ............... 365/228 |
| 2010/0094110 A1* | 4/2010 | Heller et al. ............... 600/345 |
| 2010/0177081 A1* | 7/2010 | Lee et al. ............... 345/211 |
| 2010/0208503 A1* | 8/2010 | Kuo ............... 365/51 |
| 2010/0251298 A1* | 9/2010 | Brown et al. ............... 725/39 |
| 2011/0260839 A1* | 10/2011 | Cook et al. ............... 340/10.4 |
| 2011/0298037 A1* | 12/2011 | Choe et al. ............... 257/324 |
| 2012/0155168 A1 | 6/2012 | Kim et al. |
| 2012/0218817 A1 | 8/2012 | Kang et al. |
| 2013/0003480 A1* | 1/2013 | D'Abreu et al. ............... 365/218 |
| 2013/0126957 A1 | 5/2013 | Higashitani et al. |
| 2013/0151760 A1 | 6/2013 | Cho et al. |
| 2014/0063938 A1 | 3/2014 | Oh et al. |

* cited by examiner

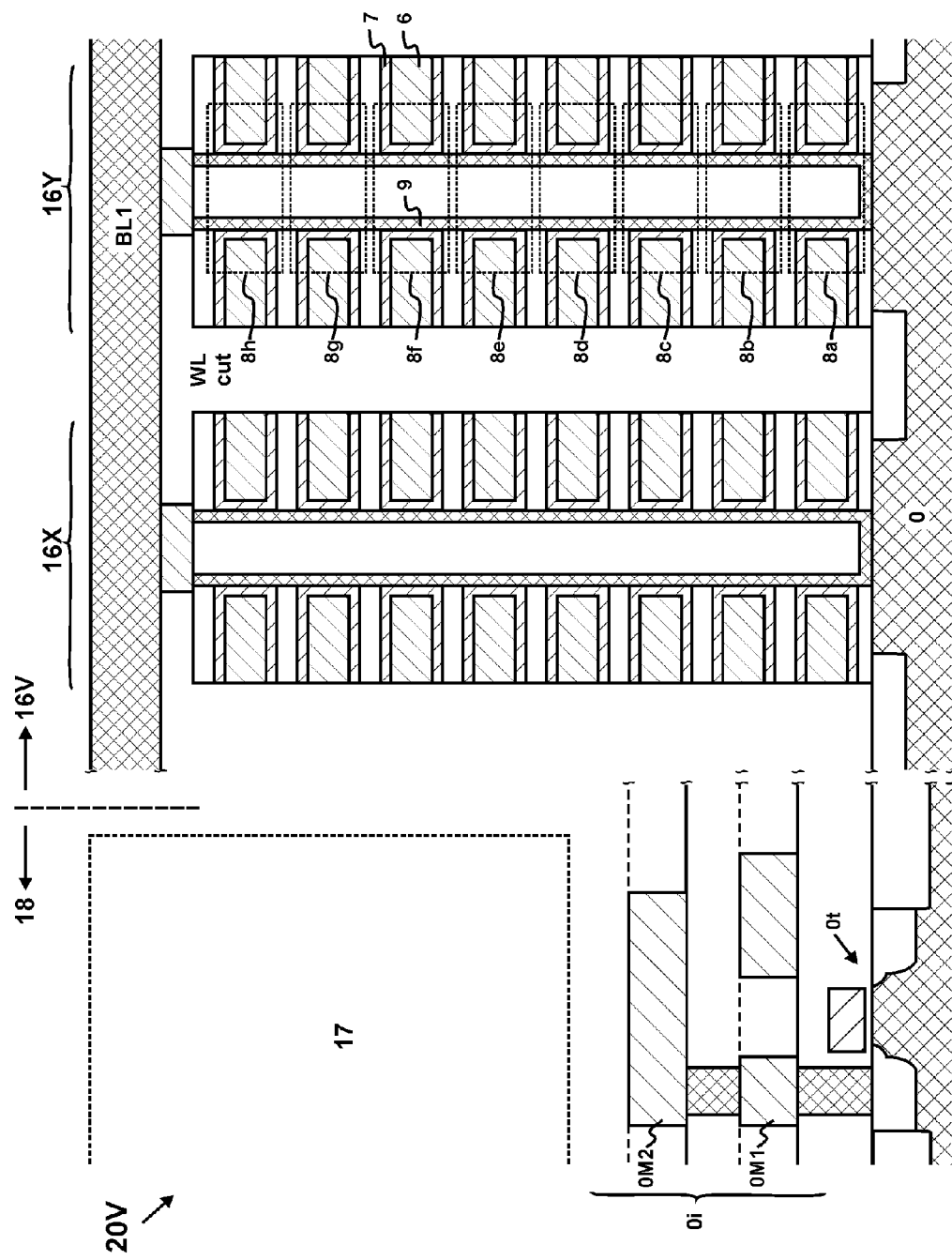

DISCRETE THREE-DIMENSIONAL VERTICAL MEMORY

CROSS-REFERENCE TO RELATED APPLICATIONS

This is a continuation-in-part of an application, "Discrete Three-Dimensional Memory Comprising Dice with Different BEOL Structures", application Ser. No. 14/047,011, filed Oct. 6, 2013, which is a continuation-in-part of an application "Discrete Three-Dimensional Memory Comprising Off-Die Read/Write-Voltage Generator", application Ser. No. 13/787,787, filed Mar. 6, 2013, which is a continuation-in-part of an application "Discrete Three-Dimensional Memory", application Ser. No. 13/591,257, filed Aug. 22, 2012, which claims benefit of a provisional application "Three-Dimensional Memory with Separate Memory-Array and Voltage-generator Substrates", Application Ser. No. 61/529,929, filed Sep. 1, 2011.

BACKGROUND

1. Technical Field of the Invention

The present invention relates to the field of integrated circuit, and more particularly to three-dimensional memory (3D-M).

2. Prior Arts

Three-dimensional memory (3D-M) is a monolithic semiconductor memory comprising a plurality of vertically stacked memory cells. It includes three-dimensional read-only memory (3D-ROM) and three-dimensional random-access memory (3D-RAM). The 3D-ROM can be further categorized into three-dimensional mask-programmed read-only memory (3D-MPROM) and three-dimensional electrically-programmable read-only memory (3D-EPROM). 3D-M may further comprise at least one of a 3D-memristor, 3D-RRAM or 3D-ReRAM (resistive random-access memory), 3D-PCM (phase-change memory), 3D-PMC (programmable metallization-cell memory), and 3D-CBRAM (conductive-bridging random-access memory).

U.S. Pat. No. 5,835,396 issued to Zhang on Nov. 3, 1998 discloses a 3D-M, more particularly a 3D-ROM. As illustrated in FIG. 1A, a 3D-M die 20 comprises a substrate-circuit level 0K and a plurality of vertically stacked memory levels 16A, 16B. The substrate-circuit level 0K comprises substrate transistors 0t and substrate interconnects 0i. The substrate transistors 0t are formed in a semiconductor substrate 0. The substrate interconnects 0i are the interconnects for the substrate transistor 0t. In this example, the substrate interconnects 0i includes metal layers 0M1, 0M2. Hereinafter, the metal layers 0M1, 0M2 in the substrate interconnects 0i are referred to as substrate interconnect layers; the materials used in the substrate interconnects 0i are referred to as substrate interconnect materials.

The memory levels 16A, 16B are stacked above the substrate-circuit level 0K. They are coupled to the substrate 0 through contact vias (e.g., 1av). Each of the memory levels (e.g., 16A) comprises a plurality of upper address lines (e.g., 2a), lower address lines (e.g., 1a) and memory cells (e.g., 5aa). The memory cells could comprise diodes, transistors or other devices. Among all types of memory cells, the diode-based memory cells are of particular interest because they have the smallest size of ~4F$^2$, where F is the minimum feature size. Since they are generally located at the cross points between the upper and lower address lines, the diode-based memory cells form a cross-point array. Hereinafter, diode is broadly interpreted as any two-terminal device whose resistance at the read voltage is substantially lower than when the applied voltage has a magnitude smaller than or polarity opposite to that of the read voltage. In one exemplary embodiment, diode is a semiconductor diode, e.g., p-i-n silicon diode. In another exemplary embodiment, diode is a metal-oxide diode, e.g., titanium-oxide diode, nickel-oxide diode.

The memory levels 16A, 16B form at least a 3D-M array 16, while the substrate-circuit level 0K comprises the peripheral circuit for the 3D-M array 16. A first portion of the peripheral circuit is located underneath the 3D-M array 16 and it is referred to as under-array peripheral circuit. A second portion of the peripheral circuit is located outside the 3D-M array 16 and it is referred to as outside-array peripheral circuits 18. Because the outside-array peripheral circuit 18 comprises significantly fewer back-end-of-line (BEOL) layers than the 3D-M array 16, the space 17 above the outside-array peripheral circuits 18 is empty and completely wasted. Hereinafter, a BEOL layer refers to the layer(s) defined by a single photolithography step during BEOL processing. In FIG. 1A, the 3D-M array 16 comprises fourteen BEOL layers, including two for each interconnect layer (e.g., 0M1, 0M2) and five for each memory level (e.g., 16A, 16B). On the other hand, the outside-array peripheral circuit 18 comprises only four BEOL layers, including two for each substrate interconnect layer (e.g., 0M1, 0M2).

U.S. Pat. No. 7,383,476 issued to Crowley et al. on Jun. 3, 2008 discloses an integrated 3D-M die, whose 3D-arrays and peripheral circuit are integrated on a same die. As is illustrated in FIG. 1B, an integrated 3D-M die 20 comprises a 3D-array region 22 and a peripheral-circuit region 28. The 3D-array region 22 comprises a plurality of 3D-M arrays (e.g., 22aa, 22ay) and their decoders (e.g., 24, 24G). These decoders include local decoders 24 and global decoders 24G. The local decoder 24 decodes address/data for a single 3D-M array, while the global decoder 24G decodes global address/data 25 to each 3D-M array.

The peripheral-circuit region 28 comprises all necessary peripheral-circuit components for a standalone integrated 3D-M die 20 to perform basic memory functions, i.e., it can directly use the voltage supply 23 provided by a user (e.g., a host device), directly read data 27 from the user and directly write data 27 to the user. It includes a read/write-voltage generator ($V_R/V_W$-generator) 21 and an address/data translator (A/D-translator) 29. The $V_R/V_W$-generator 21 provides read voltage $V_R$ and/or write (programming) voltage $V_W$ to the 3D-M array(s). The A/D-translator 29 converts address and/or data from a logical space to a physical space and/or vice versa. Hereinafter, the logical space is the space viewed from the perspective of a user of the 3D-M, while the physical space is the space viewed from the perspective of the 3D-M.

The $V_R/V_W$-generator 21 includes a band-gap reference generator 21B, a $V_R$ generator 21R and a charge-pump circuit 21W. Among them, the band-gap reference generator 21B is a precision reference generator; the $V_R$ generator 21R generates the read voltage $V_R$; and, the charge-pump circuit 21W generates the write voltage $V_W$ (referring to U.S. Pat. No. 6,486,728, "Multi-Stage Charge-pump circuit", issued to Kleveland on Nov. 26, 2002). The integrated 3D-M die 20 generates both read voltage and write voltage internally.

The A/D-translator 29 includes address translator and data translator. It includes an oscillator 290, an error checking & correction (ECC) circuit 29E, a page register/fault memory/trim-bit circuit 29P and a smart write controller 29W. The oscillator 290 provides an internal clock signal. The ECC circuit 29E detects and corrects errors while performing ECC-decoding after data are read out from the 3D-M arrays.

It also performs ECC-encoding before data are written to the 3D-M arrays (referring to U.S. Pat. No. 6,591,394, "Three-Dimensional Memory Array and Method for Storing Data Bits and ECC Bits Therein" issued to Lee et al. on Jul. 8, 2003). The page register 29P serves as an intermediate storage device between the user and the 3D-M array(s), while the fault memory/trim-bit circuit 29P performs address mapping (referring to U.S. Pat. No. 8,223,525, "Page Register Outside Array and Sense Amplifier Interface", issued to Balakrishnan et al. on Jul. 17, 2012). The smart write controller 29W collects detected errors during programming and activates the self-repair mechanism which will reprogram the data in a redundant row (referring to U.S. Pat. No. 7,219,271, "Memory Device and Method for Redundancy/Self-Repair", issued to Kleveland et al. on May 15, 2007). The integrated 3D-M die 20 performs both address translation and data translation internally.

The $V_R/V_W$-generator 21 and A/D-translator 29 are outside-array peripheral-circuit components 18. Because they occupy a large area on the 3D-M die 20, the integrated 3D-M die 20 has a low array efficiency. The array efficiency is defined as the ratio between the total memory area (i.e., the chip area used for memory) and the total chip area. In 3D-M, the total memory area ($A_M$) is the chip area directly underneath user-addressable bits (not counting bits a user cannot access) and can be expressed as $A_M = A_c * C_L = (4F^2) * C_{3D-M}/N$, where $C_L$ is the storage capacity per memory level, $A_c$ is the area of a single memory cell, $C_{3D-M}$ is the total storage capacity of the 3D-M, F is the address-line pitch, and N is the total number of memory levels in the 3D-M. In the following paragraphs, two 3D-M dice are examined for their array efficiencies.

As a first example, a 3-D one-time-programmable memory (3D-OTP) is disclosed in Crowley et al. "512 Mb PROM with 8 Layers of Antifuse/Diode Cells" (referring to 2003 International Solid-State Circuits Conference, FIG. 16.4.5). This 3D-OTP die has a storage capacity of 512 Mb and comprises eight memory levels manufactured at 0.25 um node. The total memory area is $4*(0.25\ um)^2*512\ Mb/8 = 16\ mm^2$. With a total chip area of 48.3 $mm^2$, the array efficiency of the 3D-OTP die is ~33%.

As a second example, a 3-D resistive random-access memory (3D-ReRAM) is disclosed in Liu et al. "A 130.7 $mm^2$ 2-Layer 32 Gb ReRAM Memory Device in 24 nm Technology" (referring to 2013 International Solid-State Circuits Conference, FIG. 12.1.7). This 3D-ReRAM die has a storage capacity of 32 Gb and comprises two memory levels manufactured at 24 nm node. The total memory area is $4*(24\ nm)^2*32\ Gb/2 = 36.8\ mm^2$. With a total chip area of 130.7 $mm^2$, the array efficiency of the 3D-ReRAM die is 28%.

The example in FIGS. 1A-1B is a three-dimensional horizontal memory (3D-$M_H$), whose basic storage units are horizontal memory levels. This cost-analysis can also be applied to a three-dimensional vertical memory (3D-$M_V$), whose basic storage units are vertical memory strings.

U.S. Pat. No. 8,638,611 issued to Sim et al. on Jan. 28, 2014 discloses a 3D-$M_V$. It is a vertical-NAND. Besides vertical-NAND, the 3D-ROM, 3D-RAM, 3D-memristor, 3D-ReRAM or 3D-RRAM, 3D-PCM, 3D-PMC, 3D-CBRAM disclosed above can also be arranged into 3D-$M_V$. As illustrated in FIG. 2, a 3D-$M_V$ die 20V comprises at least a 3D-$M_V$ array 16V and a peripheral circuit 18. The 3D-$M_V$ array 16V comprises a plurality of vertical memory strings 16X, 16Y. Each memory string (e.g., 16X) comprises a plurality of vertically stacked memory cells (e.g., 8a-8h). These memory cells are coupled by at least a vertical address line. Each memory cell (e.g., 8f) comprises at least a vertical transistor, with a gate 6, an information storage layer 7 and a vertical channel 9. As an integrated 3D-$M_V$, the 3D-$M_V$ array 16V and its peripheral circuit 18 are integrated into a single die 20V.

A notable difference between 3D-$M_H$ (FIG. 1A) and 3D-$M_V$ (FIG. 2) is that the horizontal memory levels 16A, 16B in 3D-$M_H$ do not include any portion of the substrate 0, whereas the vertical memory strings 16X, 16Y in 3D-$M_V$ include a portion of the substrate 0. In other words, the 3D-$M_H$ die 20 could comprise an under-array peripheral circuit, whereas the 3D-$M_V$ die 20V cannot comprise any under-array peripheral circuit. The peripheral circuit 18 for the 3D-$M_V$ 20V is completely located outside the 3D-$M_V$ array 16V. It comprises substrate transistors 0t and substrate interconnects 0i. The substrate transistors 0t are conventional (horizontal) transistors, which are formed in a semiconductor substrate 0. The substrate interconnects 0i are the interconnects for the substrate transistor 0t. In this example, the substrate interconnects 0i includes metal layers 0M1, 0M2.

It is a prevailing belief in the field of integrated circuit that more integration is always desired. However, this belief is no longer true for any 3D-M (including both 3D-$M_H$ and 3D-$M_V$). For 3D-$M_H$, because the peripheral circuit 18 comprises significantly fewer BEOL layers than the 3D-$M_H$ arrays 16, integration would force the peripheral circuit 18 to use the expensive BEOL manufacturing process of the 3D-$M_H$ arrays 16 and therefore, increases the overall 3D-$M_H$ cost. Similarly, for 3D-$M_V$, because the vertical memory strings 16X, 16Y use a complex BEOL process whereas the peripheral circuit 18 uses a relatively simple BEOL process, integrating the vertical memory strings 16X, 16Y with their peripheral circuit 18 will force the peripheral circuit 18 to use the expensive BEOL manufacturing process for the vertical memory strings 16X, 16Y. As a result, integration does not lower the overall cost, but actually increases the overall cost of the 3D-$M_V$.

OBJECTS AND ADVANTAGES

It is a principle object of the present invention to provide a three-dimensional vertical memory (3D-$M_V$) with a lower overall cost.

It is another object of the present invention to improve the array efficiency of the 3D-$M_V$.

In accordance with these and other objects of the present invention, a discrete 3D-$M_V$ is disclosed.

SUMMARY OF THE INVENTION

To lower the overall cost of the 3D-$M_V$, the present invention follows this design guideline: separate the 3-D circuit and 2-D circuit into different dice in such a way that they could be optimized separately. To improve the array efficiency of the 3D-array die, its peripheral circuit should be minimized. For example, the voltage-generator could be separated into another die. Accordingly, the present invention discloses a discrete 3D-$M_V$. It comprises at least a 3D-array die and at least a voltage-generator die. The 3D-array die (3-D circuit) is formed in a 3-D space and comprises a plurality of functional levels. The voltage-generator die is formed on a 2-D plane and comprises just a single functional level. Because it is an essential circuit for the 3D-$M_V$ to perform basic memory functions, absence of any voltage-generator component makes the 3D-array die per se not a functional memory. Discrete 3D-$M_V$ brings one key benefit: the 3D-array die has a higher array efficiency.

Designed and manufactured separately, the 3D-array die and the voltage-generator die in a discrete 3D-$M_V$ can have substantially different back-end-of-line (BEOL) structures: the voltage-generator die can have much fewer BEOL layers. Although the 3D-array die has a similar wafer cost to the integrated 3D-$M_V$ die, the voltage-generator die has a much lower wafer cost because it can be manufactured using an independent but much less complex BEOL process. Overall, the discrete 3D-$M_V$ has a lower cost than the integrated 3D-$M_V$ for a given storage capacity.

BRIEF DESCRIPTION OF THE DRAWINGS

FIG. 2 is a cross-sectional view of an integrated three-dimensional vertical memory (3D-$M_V$) (prior art);

Figure 1A:
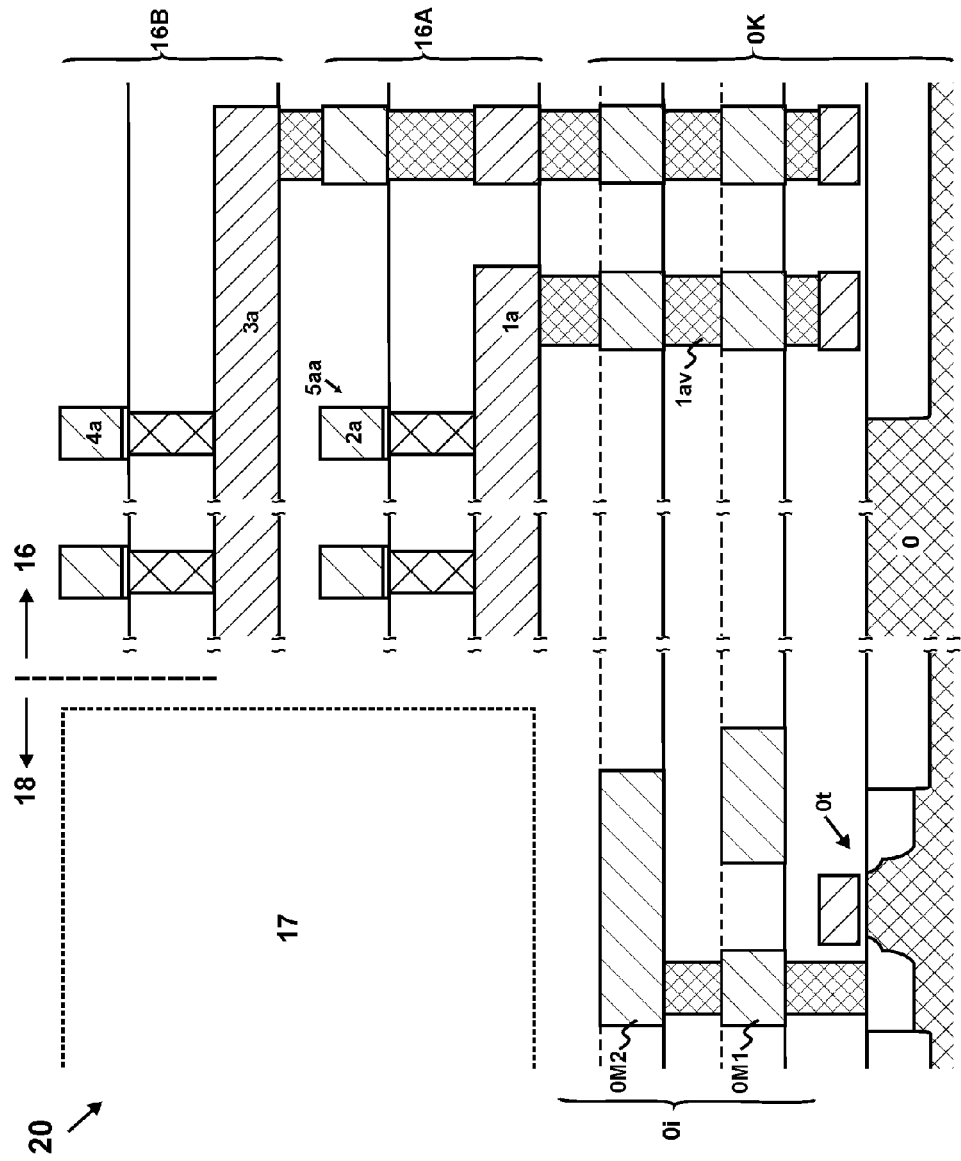
FIG. 1A is a cross-sectional views of an integrated three-dimensional horizontal memory (3D-$M_H$) (prior art)
Figure 1B:
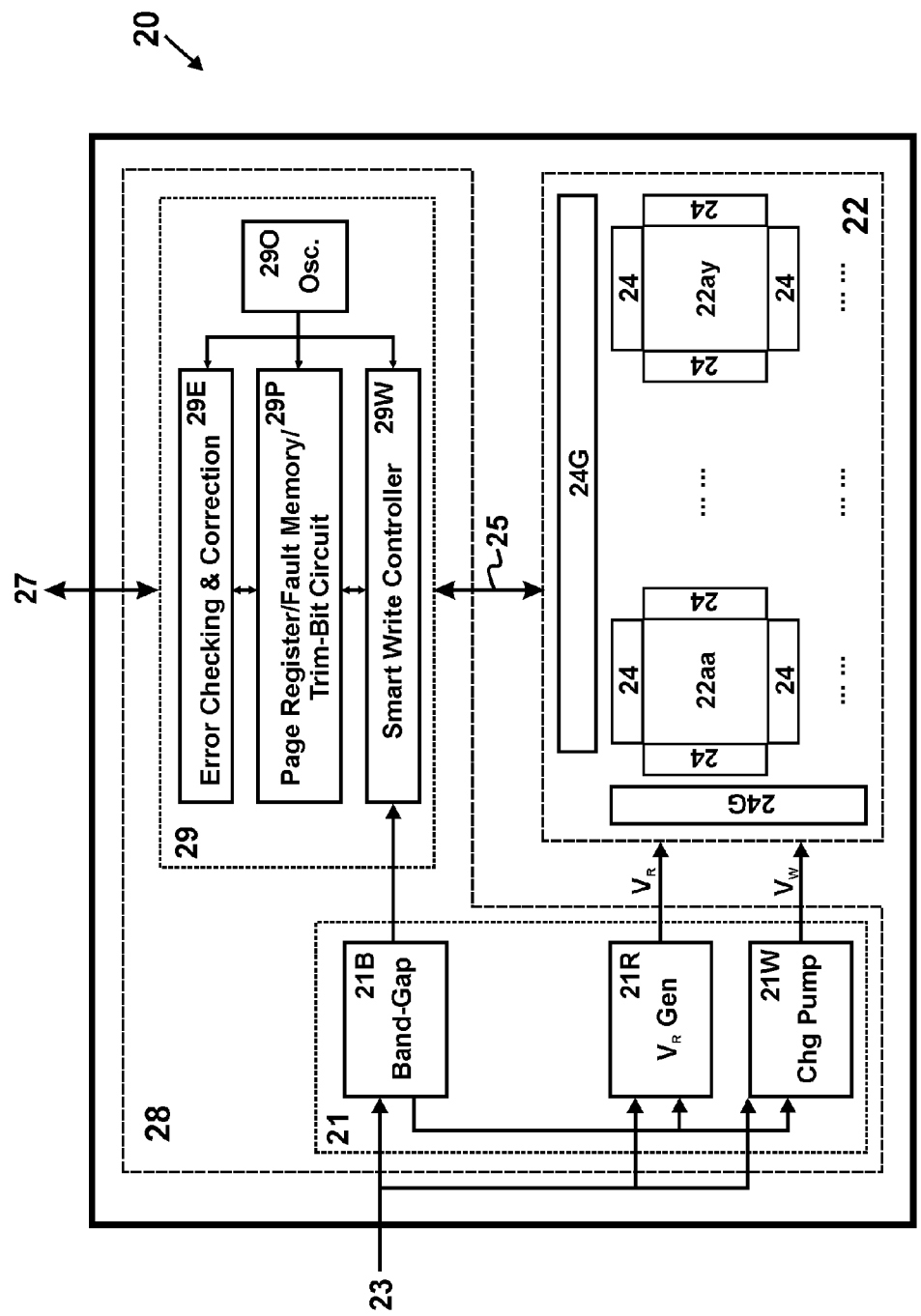
FIG. 1B is a block diagram of an integrated 3D-$M_H$ die (prior art)

It should be noted that all the drawings are schematic and not drawn to scale. Relative dimensions and proportions of parts of the device structures in the figures have been shown exaggerated or reduced in size for the sake of clarity and convenience in the drawings. The same reference symbols are generally used to refer to corresponding or similar features in the different embodiments.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

In the present invention, the symbol "/" means a relationship of "and" or "or". For example, the read/write voltage could be either only the read voltage, or only the write voltage, or both the read voltage and the write voltage. In another example, the address/data could be either only address, or only data, or both address and data.

Figure 3A:
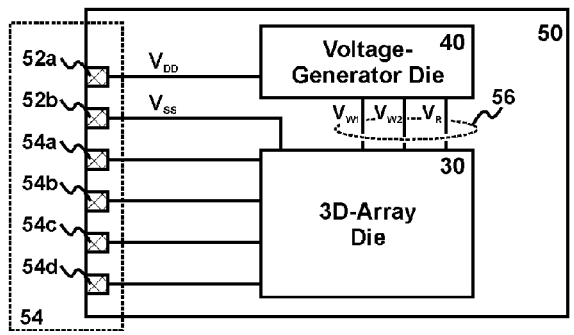
FIG. 3A illustrates a first preferred discrete 3D-$M_V$.
Figure 3B:
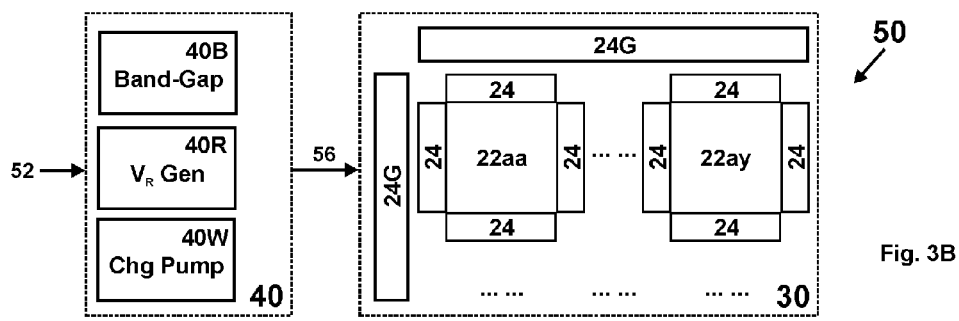
FIG. 3B is its circuit block diagram.

Referring now to FIGS. 3A-3B, a preferred discrete three-dimensional vertical memory (3D-$M_V$) 50 is disclosed. It comprises a 3D-array die 30 (a 3-D circuit) and a voltage-generator die 40 (a 2-D circuit). The 3D-array die 30 is formed in a 3-D space and comprises a plurality of functional levels (i.e., memory levels). The voltage-generator die 40 is formed in a 2-D space and comprises a single functional level. Separating the 3-D circuit and 2-D circuit into discrete dice can help to optimize them separately.

The discrete 3D-$M_V$ 50 of FIG. 3A is a memory card. It includes a physical interface 54 according to a standard for connecting to a variety of hosts. Physical interface 54 includes individual contacts 52a, 52b, 54a-54d that connect with corresponding contacts in a host receptacle. The power-supply contact 52a is provided to connect to a power-supply contact in the host receptacle. The voltage supplied by the host to power-supply contact 52a is referred to as voltage supply $V_{DD}$. The ground contact 52b provides a ground connection at a voltage $V_{SS}$. The contacts 54a-54d provide signal connections between the host and the discrete 3D-$M_V$ 50. The signals represented on the contacts 54a-54d include address and data, among others. Because they are directly to/from the host, the address and data represented on the contacts 54a-54d are logical address and logical data.

The voltage-generator die 40 receives a voltage supply $V_{DD}$ from the power-supply contact 52a and provides the 3D-array die 30 with at least a read/write voltage through a power bus 56. The read/write voltage includes at least a read voltage and/or a write voltage other than the voltage supply $V_{DD}$. In other words, it could be either at least a read voltage $V_R$, or at least a write voltage $V_W$, or both read voltage $V_R$ and write voltage $V_W$, with the values of $V_R$ and $V_W$ different from $V_{DD}$. In this preferred embodiment, the read/write voltage includes one read voltage $V_R$ and two write voltages $V_{W1}$, $V_{W2}$. Alternatively, it could include more than one read voltage or more than two write voltages.

FIG. 3B is a block diagram of the preferred discrete 3D-$M_V$ 50. The 3D-array die 30 comprises the 3D-M arrays 22aa ... 22ay ... and their decoders 24, 24G. The voltage-generator die 40 is located between the global decoder 24G of the 3D-array die 30 and the physical interface 54. It comprises at least a voltage-generator component of the 3D-$M_V$. Different from the integrated 3D-$M_V$, this voltage-generator component is formed on the voltage-generator die 40 instead of the 3D-array die 30. Because it is an essential circuit for the 3D-$M_V$ to perform basic memory functions, absence of this voltage-generator component makes the 3D-array die 30 per se not a functional memory.

The voltage generator of the 3D-$M_V$ could comprise many voltage-generator components. Examples include a band-gap reference generator (precision reference generator) 40B, a $V_R$ generator 40R and a charge-pump circuit 40W. The $V_R$ generator 40R generates the read voltage $V_R$, while the charge-pump circuit 40W generates the write voltage $V_W$ (referring to U.S. Pat. No. 6,486,728, "Multi-Stage Charge-pump circuit", issued to Kleveland on Nov. 26, 2002). More examples of the voltage-generator components are disclosed in FIGS. 7A-7C.

Figure 4:
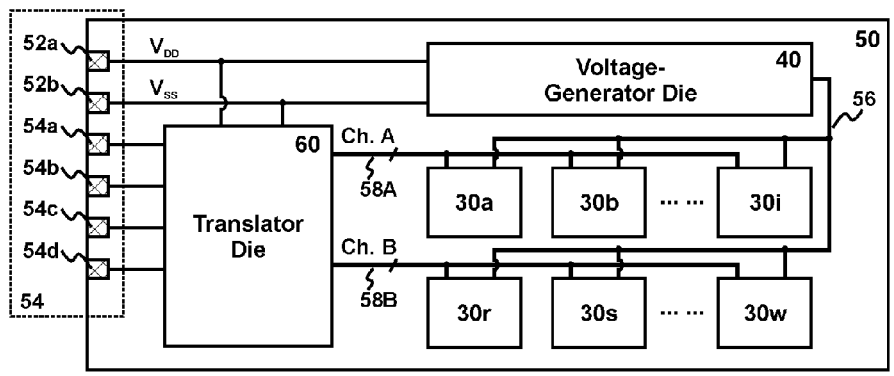
FIG. 4 illustrates a second preferred discrete 3D-$M_V$.

Referring now to FIG. 4, another preferred discrete 3D-$M_V$ 50 is disclosed. This preferred embodiment is used for a high-capacity memory card or a solid-state drive. It comprises a plurality of 3D-array dice 30a, 30b ... 30w. The voltage-generator 40 uses the power bus 56 to provide read/write voltage(s) to all 3D-array dice. The translator die 60 translates logical address/data from the contacts 54a-54d into physical address/data. The 3D-array dice form two channels: Channel A and Channel B. The internal bus 58A on Channel A provides these physical address/data to the 3D-array dice 30a, 30b ... 30i, while the internal bus 58B on Channel B provides these physical address/data to the 3D-array dice 30r, 30s ... 30w. Although two channels are used in this example, it should be apparent to those skilled in the art that more than two channels may be used.

Figure 5:
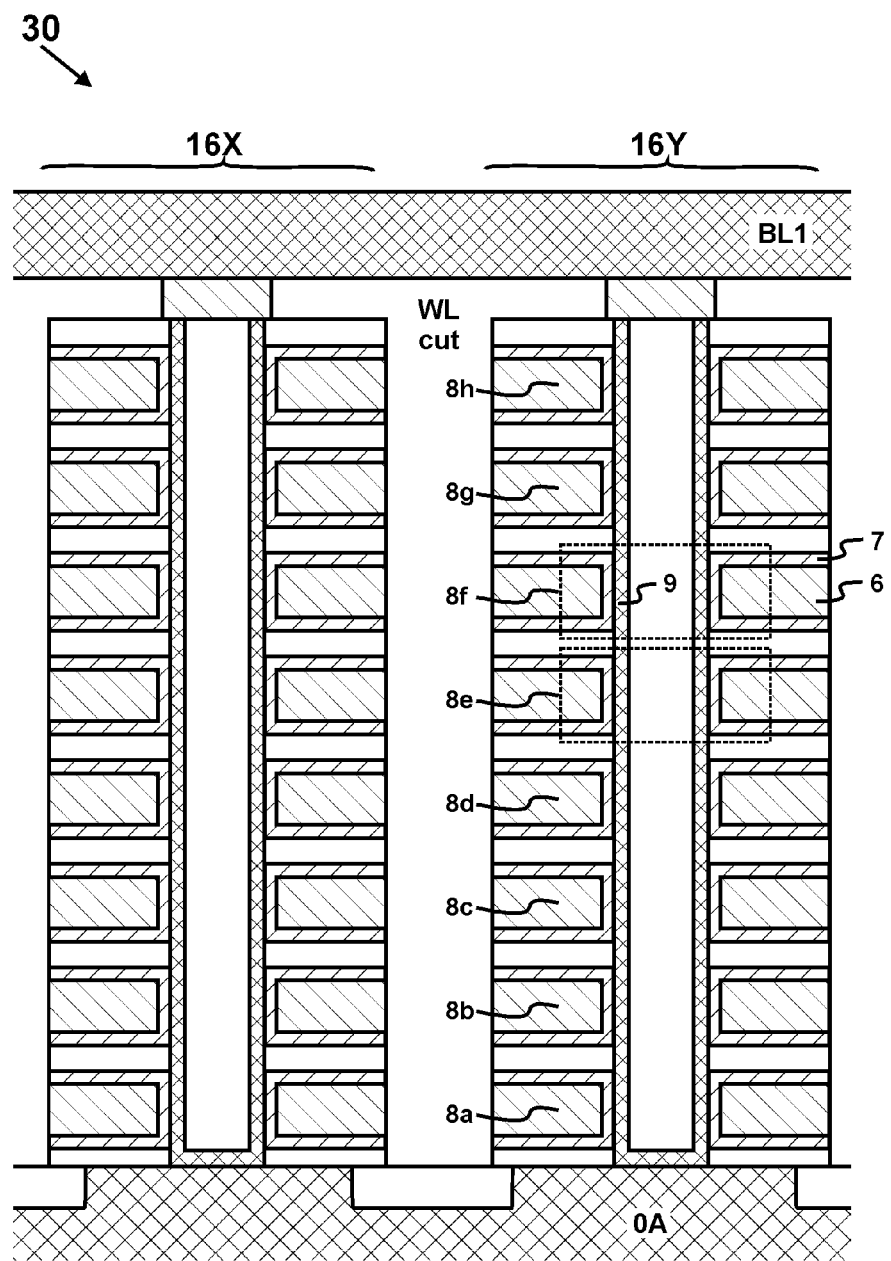
FIG. 5 is a cross-sectional views of a preferred 3D-array dice.

Referring now to FIG. 5, a cross-sectional view of a preferred 3D-array die 30 is disclosed. The preferred 3D-array die 30 is formed in a 3-D space and comprises a plurality of vertical memory strings 16X, 16Y. Each memory string (e.g., 16Y) comprises a plurality of vertically stacked memory cells (e.g., 8a-8h). These memory cells are coupled by at least a vertical address line. Each memory cell (e.g., 8f) comprises at least a vertical transistor, with a gate 6, an information storage layer 7 and a vertical channel 9. An exemplary memory cell is a vertical-NAND cell. Because a vertical-NAND string comprises a large number (from 24 to 256) of vertically stacked memory cells, a 3D-array die 30 comprises a large number (from 24 to 256) of BEOL layers.

Figure 6:
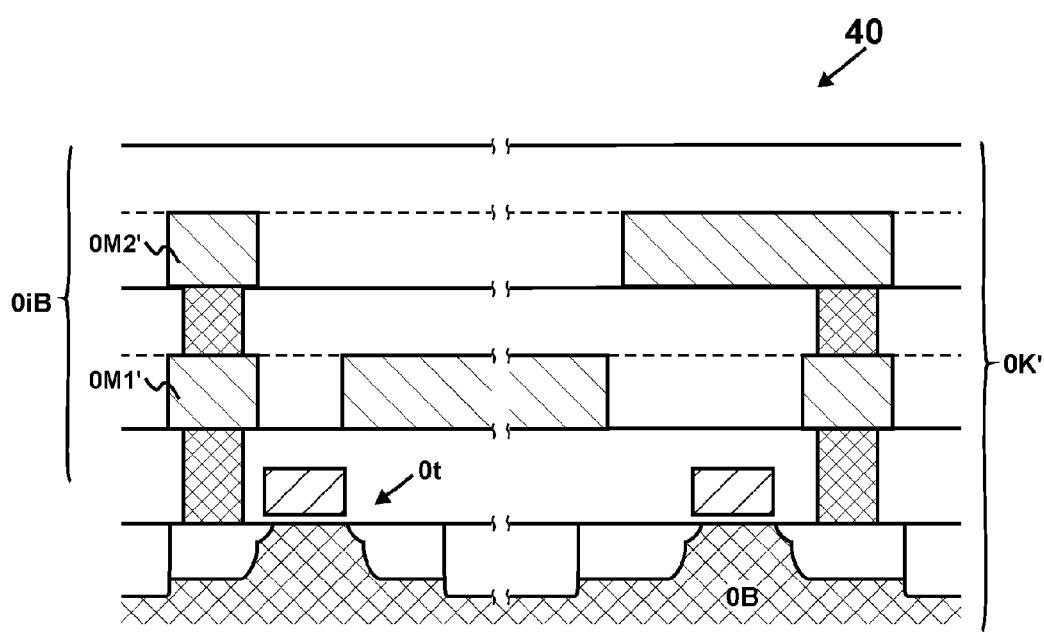
FIG. 6 is a cross-sectional view of a preferred voltage-generator dice.

Referring now to FIG. 6, a cross-sectional view of a preferred voltage-generator die 40 is disclosed. The voltage-generator die 40 is formed on a 2-D plane and includes a single functional level, i.e., the substrate-circuit level 0K'. The substrate-circuit level 0K' comprises substrate transistors 0t and substrate interconnects 0iB. The substrate transistors are formed in a voltage-generator substrate 0B. The substrate interconnects 0iB comprise two interconnect layers, i.e., metal layers 0M1'-0M2'. Because each substrate interconnect layer (e.g., 0M1') comprises two BEOL layers, the voltage-generator die 40 comprises a total of only four BEOL layers.

Designed and manufactured separately, the 3D-array die 30 and the voltage-generator die 40 in a discrete 3D-$M_V$ 50 can have substantially different BEOL structures: the voltage-generator die 40 can have much fewer BEOL layers. Although the 3D-array die 30 has a similar wafer cost to the integrated 3D-$M_V$ die 20V, the voltage-generator die 40 has a much lower wafer cost because it can be manufactured using an independent but much less complex BEOL process. Overall, the discrete 3D-$M_V$ 50 has a lower cost than the integrated 3D-$M_V$ 20V for a given storage capacity.

For a conventional two-dimensional memory (2D-M, whose memory cells are arranged on a 2-D plane, e.g., flash memory), although it is possible to form at least a voltage-generator component on a voltage-generator die instead of a 2D-array die, doing so will increase the overall 2D-M cost. This is because the 2D-array die and the voltage-generator die have similar BEOL structures and similar wafer costs. Adding the extra bonding cost, a discrete 2D-M is more expensive than an integrated 2D-M. This is in sharp contrast to the 3D-$M_V$. The 3D-array die 30 and voltage-generator die 40 of a discrete 3D-$M_V$ 50 have substantially different BEOL structures. As a result, a discrete 3D-$M_V$ is less expensive than an integrated 3D-M.

Figure 7A:
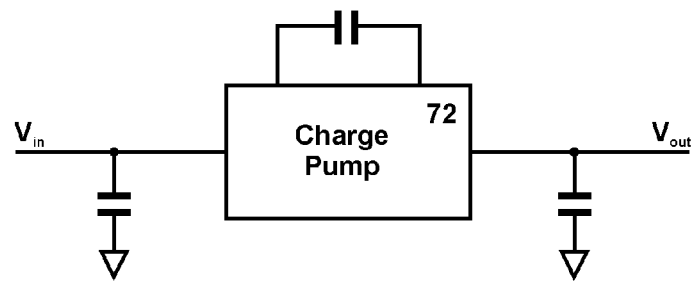
FIGS. 7A-7C are block diagrams of three preferred voltage-generator components.
Figure 7B:
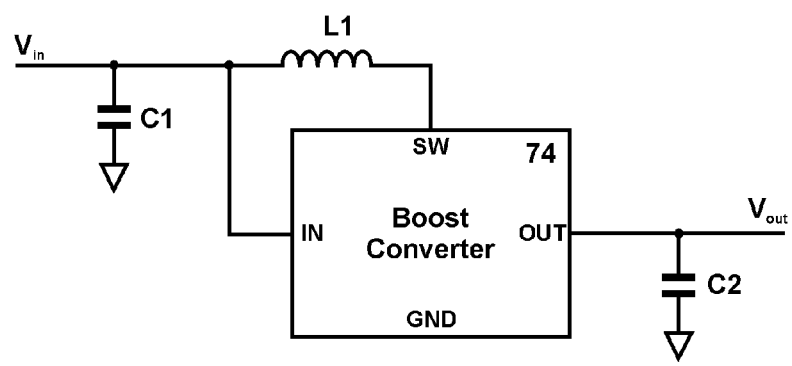
Figure 7C:
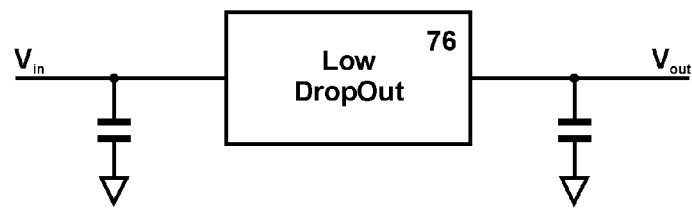

Referring now to FIGS. 7A-7C, three preferred voltage-generator components are disclosed. The voltage-generator component preferably uses a DC-to-DC converter. It could be a step-up, whose output voltage is higher than the input voltage, or a step-down, whose output voltage is lower than the input voltage. Examples of step-up include charge pump (FIG. 7A) and boost converter (FIG. 7B), and examples of step-down include low dropout (FIG. 7C) and buck converter.

In FIG. 7A, the voltage-generator component includes a charge pump 72 to provide an output voltage $V_{out}$ that is higher than the input voltage $V_{in}$. The voltage-generator component may include one or more integrated circuits and also include one or more discrete devices. Charge pump 72 may generally be formed having a low profile that fits within the physical constraints of low-profile memory cards.

In FIG. 7B, the voltage-generator component is a high frequency boost converter 74. It may also be used to generate an output voltage $V_{out}$ that is higher than an input voltage $V_{in}$. A boost converter may be formed with a low profile inductor so that the profile of the $V_R/V_W$-generator is within the limits for a memory card or a solid-state drive.

In FIG. 7C, the voltage-generator component includes a low dropout (LDO) 76 to provide an output voltage $V_{out}$ that is lower than the input voltage $V_{in}$. Generally, an LDO uses one or more (in this case, two) capacitors. Thus, the voltage-generator component may be comprised of at least one die and may also include one or more discrete devices.

Figure 8A:
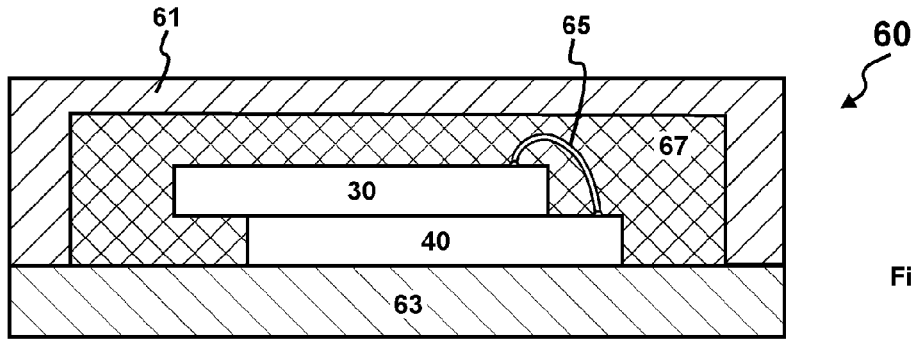
FIGS. 8A-8B are cross-sectional views of two preferred discrete 3D-$M_V$ packages.
Figure 8B:
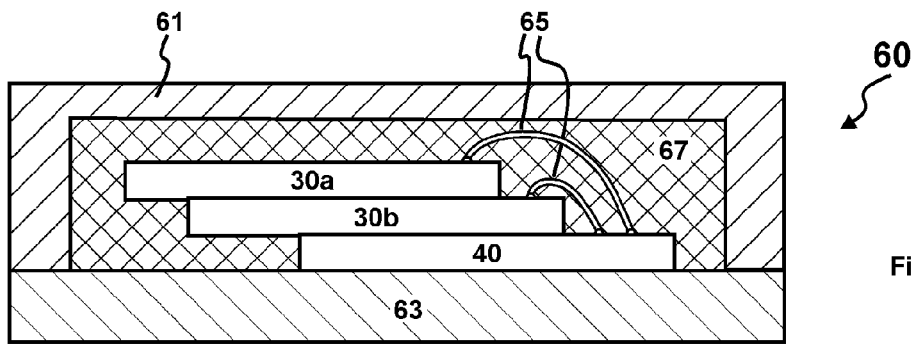
Figure 8C:
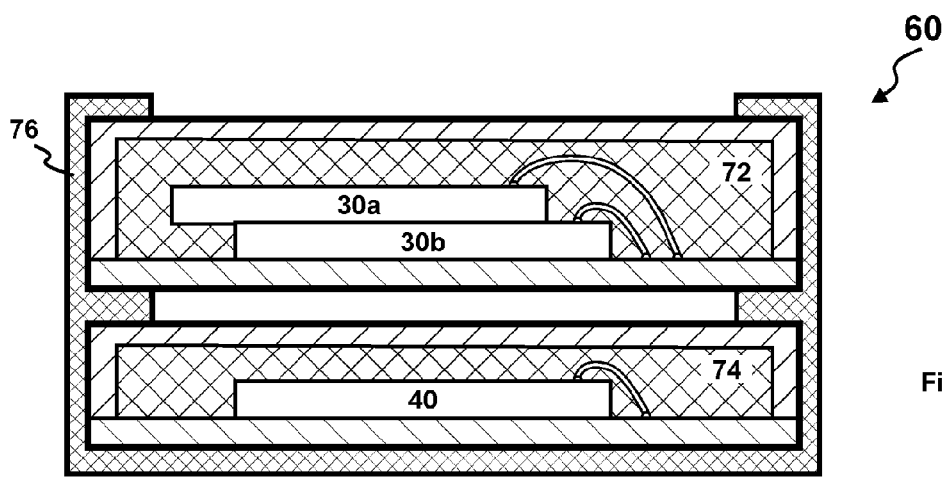
FIG. 8C is a cross-sectional view of a preferred discrete 3D-$M_V$ module.

Referring now to FIG. 8A-8C, several preferred discrete 3D-$M_V$ packages (or, module) 60 are disclosed. The 3D-$M_V$ packages in FIGS. 8A-8B are multi-chip package (MCP), while the 3D-$M_V$ module in FIG. 8C is a multi-chip module (MCM). These MCP and MCM can be used as a memory card and/or a solid-state drive.

The preferred discrete 3D-$M_V$ package 60 of FIG. 8A comprises two separate dice: a 3D-array die 30 and a voltage-generator die 40. These dice 30, 40 are vertically stacked on a package substrate 63 and located inside a package housing 61. Bond wires 65 provide electrical connection between the dice 30 and 40. Here, bond wire 65 provides a coupling means between the 3D-array die 30 and the voltage-generator die 40. Other exemplary coupling means include solder bump. To ensure data security, the dice 30, 40 are preferably encapsulated into a molding compound 67. In this preferred embodiment, the 3D-array die 30 is vertically stacked above the voltage-generator die 40. Alternatively, the voltage-generator die 40 can be vertically stacked above the 3D-array die 30; or, the 3D-array die 30 can be stacked face-to-face towards the voltage-generator die 40; or, the 3D-array die 30 can be mounted side-by-side with the voltage-generator die 40.

The preferred discrete 3D-$M_V$ package 60 of FIG. 8B comprises two 3D-array dice 30a, 30b and a voltage-generator die 40. These dice 30a, 30b, 40 are three separate dice. They are located inside a package housing 61. The 3D-array die 30a is vertically stacked on the 3D-array die 30b, and the 3D-array die 30b is vertically stacked on the voltage-generator die 40. Bond wires 65 provide electrical connections between the dice 30A, 30B, and 40.

The preferred discrete 3D-$M_V$ module 60 of FIG. 8C comprises a module frame 76, which houses two discrete packages, i.e., a 3D-array package 72 and a voltage-generator package 74. The 3D-array package 72 comprises two 3D-array dice 30a, 30b, while the voltage-generator package 74 comprises a voltage-generator die 40. The module frame 76 provides electrical connections between the 3D-array package 72 and the voltage-generator package 74 (not drawn in this figure).

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. A discrete three-dimensional vertical memory (3D-$M_V$), comprising:
   a 3D-array die comprising a substrate and at least a 3D-$M_V$ array including a plurality of vertical memory strings, each of said vertical memory strings comprising a plurality of vertically stacked memory cells;
   a voltage-generator die comprising at least a portion of a voltage generator for providing said 3D-array die with at least a voltage other than the voltage supply, wherein said portion of said voltage generator is absent from said 3D-array die;
   wherein said 3D-array die comprises more back-end-of-line (BEOL) layers than said voltage-generator die; and, said 3D-array die and said voltage-generator die are separate dice.

2. The memory according to claim 1, wherein each of said vertical memory strings includes a portion of said substrate.

3. The memory according to claim 1, wherein each of said vertical memory strings is in contact with said substrate.

4. The memory according to claim 1, wherein each of said vertically stacked memory cells comprises a vertical transistor.

5. The memory according to claim 1, wherein said vertical transistor comprises a vertical channel.

6. The memory according to claim 1, wherein each of said vertically stacked memory cells is a vertical-NAND cell.

7. The memory according to claim 1, wherein said 3D-$M_V$ array does not comprise any under-array peripheral circuit.

8. The memory according to claim 1, wherein said voltage-generator die comprises horizontal transistors.

9. The memory according to claim 1, wherein said voltage generator comprises a read-voltage generator.

10. The memory according to claim 1, wherein said voltage generator comprises a write-voltage generator.

11. The memory according to claim 1, wherein said voltage generator comprises a band-gap reference generator.

12. The memory according to claim 1, wherein said voltage generator comprises $V_R$ generator.

13. The memory according to claim 1, wherein said voltage generator comprises a charge-pump circuit, a boost converter, a low-dropout regulator, or a buck converter.

14. The memory according to claim 1, wherein said 3D-array die and said voltage-generator die are located in a memory package, a memory module, a memory card, or a solid-state drive.

15. The memory according to claim 1, further comprising:
another 3D-array die comprising another substrate and at least another 3D-$M_V$ array including another plurality of vertical memory strings;
wherein said voltage-generator die comprises at least another portion of another voltage generator for said another 3D-array die.

16. The memory according to claim 15, wherein each vertical memory string in said another 3D-array die includes another portion of said another substrate.

17. The memory according to claim 15, wherein said another 3D-$M_V$ array does not comprise any under-array peripheral circuit.

18. The memory according to claim 15, wherein said 3D-array die, said another 3D-array die and said voltage-generator die are located in a memory package, a memory module, a memory card, or a solid-state drive.

19. The memory according to claim 1, wherein said 3D-$M_V$ is a three-dimensional read-only memory (3D-ROM) or a three-dimensional random-access memory (3D-RAM).

20. The memory according to claim 1, wherein said 3D-$M_V$ is a 3D-memristor, 3D-RRAM or 3D-ReRAM, a 3D-PCM, a 3D-PMC, or a 3D-CBRAM.

\* \* \* \* \*

UNITED STATES PATENT AND TRADEMARK OFFICE
CERTIFICATE OF CORRECTION

PATENT NO. : 9,123,393 B2  
APPLICATION NO. : 14/636359  
DATED : September 1, 2015  
INVENTOR(S) : Zhang Page 1 of 1

It is certified that error appears in the above-identified patent and that said Letters Patent is hereby corrected as shown below:

Title Page,

Item "(71) Applicant:" replace "HangZhou HaiCun information Technology Co. Ltd., ChengDu (CN)" with "-- HangZhou HaiCun Information Technology Co., Ltd., HangZhou, ZheJiang (CN) --"

Item "(73) Assignees:" replace "HangZhou KiCun nformation Technology Co. Ltd., HangZhejiang (CN); Guobiao Zhang, Corvallis, OR (US)" with "-- HangZhou HaiCun Information Technology Co., Ltd., HangZhou, ZheJiang (CN); Guobiao Zhang, Corvallis, OR (US) --"

Signed and Sealed this  
Twenty-eighth Day of June, 2016

Michelle K. Lee  
*Director of the United States Patent and Trademark Office*